United States Patent
Hu

[11] Patent Number: 6,004,869
[45] Date of Patent: Dec. 21, 1999

[54] METHOD FOR MAKING A LOW RESISTIVITY ELECTRODE HAVING A NEAR NOBLE METAL

[75] Inventor: Yongjun Hu, Boise, Id.

[73] Assignee: Micron Technology, Inc., Boise, Id.

[21] Appl. No.: 08/845,616

[22] Filed: Apr. 25, 1997

[51] Int. Cl.$^6$ .............................................. H01L 21/3205
[52] U.S. Cl. ..................... 438/585; 438/590; 438/652; 438/655
[58] Field of Search ..................... 438/652, 653, 438/686, 655, 660, 661, 663, 664, 669, 585, 586, 590, 592, 593, FOR 349, FOR 353, FOR 356, FOR 361, FOR 362

[56] References Cited

U.S. PATENT DOCUMENTS

| | | | |
|---|---|---|---|
| 4,373,251 | 2/1983 | Wilting ..................................... | 438/592 |
| 4,529,619 | 7/1985 | Nemanich et al. ..................... | 438/482 |
| 5,047,367 | 9/1991 | Wei et al. ............................... | 438/607 |
| 5,136,362 | 8/1992 | Grief et al. ............................. | 357/67 |
| 5,451,545 | 9/1995 | Ramaswami et al. .................. | 438/649 |
| 5,483,741 | 1/1996 | Akram et al. ........................... | 29/846 |
| 5,597,745 | 1/1997 | Byun et al. ............................. | 438/239 |
| 5,605,865 | 2/1997 | Maniar et al. .......................... | 438/301 |
| 5,633,200 | 5/1997 | Hu ............................................ | 438/653 |
| 5,668,040 | 9/1997 | Byun ....................................... | 438/396 |
| 5,717,253 | 2/1998 | Shin et al. .............................. | 438/653 |
| 5,763,923 | 6/1998 | Hu et al. ................................ | 257/382 |
| 5,830,801 | 11/1998 | Shiralagi et al. ...................... | 438/586 |

*Primary Examiner*—Carl Whitehead, Jr.
*Assistant Examiner*—Khanh Duong
*Attorney, Agent, or Firm*—Schwegman, Lundberg, Woessner & Kluth P.A.

[57] ABSTRACT

A method for forming conductive lines such as interconnects and DRAM gate stacks. A blanket stack is formed on a substrate including a conductive diffusion barrier, a near noble metal such as cobalt, followed by a silicon layer and a top insulator layer. The blanket stack is patterned with resist to define the conductive lines. The stack is dry etched down to the near noble metal layer. The resist is then removed and the stack is annealed to react the near noble metal and silicon to form a conductive compound having fine grain size. The unreacted noble metal is then wet etched, using the conductive diffusion barrier as a wet etch stop. A further dry etch is then performed down to the substrate, using the top insulator layer as a mask. In this manner, only one mask is required to form the conductive line.

46 Claims, 4 Drawing Sheets

METHOD FOR MAKING A LOW RESISTIVITY ELECTRODE HAVING A NEAR NOBLE METAL

FIELD OF THE INVENTION

The present invention relates generally to fabricating low resistivity conductive lines and electrodes, and more specifically to fabricating low resistivity conductive lines and electrodes using near noble metals and their compounds.

BACKGROUND OF THE INVENTION

Metal Oxide Semiconductor (MOS) devices are widely used today in ultra large scale integrated (ULSI) devices. MOS devices include memory devices which are comprised of an array of memory cells. Each memory cell is comprised of a capacitor, on which the charge stored represents the logical state of the memory cell. Long conductors, referred to as word lines, serve as gates of multiple access transistors, each of which provides access to a memory cell.

In a dynamic random access memory (DRAM) a common word line is fabricated on a p-type silicon substrate coated with a thin film of silicon dioxide ($SiO_2$), known as gate oxide. Word lines currently are formed on the gate oxide layer as a two-layer stack, comprising silicon (or polysilicon), coated with a conductor material such as tungsten silicide or titanium silicide.

Of primary concern is minimizing resistivity throughout the word line due to the need to reduce RC time constants and access multiple memory cells in as short a period of time as possible. The problem is especially critical due to the extended length of word lines as DRAMs increase in density.

As DRAM density increases, feature sizes, including line sizes, decrease. For example, when the feature size of a conductor, such as tungsten or titanium silicides, is reduced in higher density memories, the Kelvin contact resistance of the conductor increases. Titanium silicide is a large grain material. Thin titanium silicide has nonuniform large grain size that contributes to a very rough titanium silicide/silicon interface. As such, it reduces the effective ohmic contact area. It is therefore desirable to utilize conductors that have smaller grains and hence whose resistivity will not significantly increase for the same feature dimensions.

Conductors utilizing near noble metal silicides, such as $CoSi_2$ have low bulk resistivity and a fine grain with very small line-width dependent Rs effects. They are well suited for sub-quarter micron conductor formation such as polycide word lines or bit lines. However, they are very difficult to pattern because of the nonvolatile nature of cobalt fluorides and chlorides during a dry etch process. Conventional methods of patterning $CoSi_2$ polycide gate electrodes for DRAM devices require extra masks to pattern insulating layers or spacers. A Co salicidation is then used on fill-in Si (poly). The extra masks can significantly increase costs of DRAM devices.

There is a need to decrease the overall resistivity of a word line stack and local interconnects at sub-quarter micron dimensions. There is a need to precisely pattern $CoSi_2$ conductors and word line stacks without introducing additional masks. There is a further need to precisely etch such conductors and word line stacks in an inexpensive manner.

SUMMARY OF THE INVENTION

A method for forming conductive lines for a semiconductor device, comprises forming a blanket stack on a substrate including a conductive diffusion barrier, a near noble metal such as cobalt, followed by a silicon layer and a top insulator layer. The blanket stack is patterned with resist to define the conductive lines. The stack is etched down to the near noble metal layer. The resist is then removed and the stack is annealed to react the near noble metal and semiconductor to form a conductive compound having fine grain size. The unreacted noble metal is then etched, using the conductive diffusion barrier as an etch stop.

In one embodiment, a further etch is then performed down to the substrate, using the top insulator layer as a mask. In this manner, only one mask is required to form the conductive line.

In one embodiment, the semiconductor device comprises a DRAM (Dynamic Random Access Memory) device, and the conductor is a $CoSi_2$ gate stack. The heating step comprises an anneal at temperatures in excess of approximately 550 degrees Celsius, or at least great enough to react the cobalt and silicon. The gate stack also serves as a word line for the DRAM device. The word line width is sub-quarter micron.

In a further embodiment, the cobalt is etched using a wet etch process which has a high selectivity with respect to $CoSi_2$. The conductive diffusion barrier comprises tungsten nitride or titanium nitride and acts as a stop for the wet etch with at least of portion of it also being etched. The further etch to the substrate is performed using a common dry etch. Further standard process flow is followed to complete the semiconductor device.

Further features and advantages of the present invention, as well as the structure and operation of various embodiments of the present invention, are described in detail below with reference to the accompanying drawings.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawings in which the reference number first appears.

DETAILED DESCRIPTION OF THE EMBODIMENTS

In the following detailed description of the embodiments, reference is made to the accompanying drawings which form a part hereof, and in which is shown by way of illustration specific embodiments in which the inventions may be practiced.

Substrate is used to refer to supporting semiconductor structures during processing. It is understood as including silicon-on-sapphire (SOS) technology, silicon-on-insulator (SOI) technology, doped and undoped semiconductors, epitaxial layers of a silicon supported by a base semiconductor, as well as other semiconductor structures well known to one skilled in the art. Furthermore, when reference is made to substrate in the following description, previous process steps may have been utilized to form regions/junctions in the base semiconductor structure. Scaling in the Figures does not represent precise dimensions of the structures illustrated.

The present invention is directed toward facilitating low-cost fabrication of low resistivity conductors and electrodes in MOS devices and integrated circuits. This goal is achieved by using near noble metals and a combination of wet and dry etch steps without adding additional masks to the fabrication process.

Figure 1A:
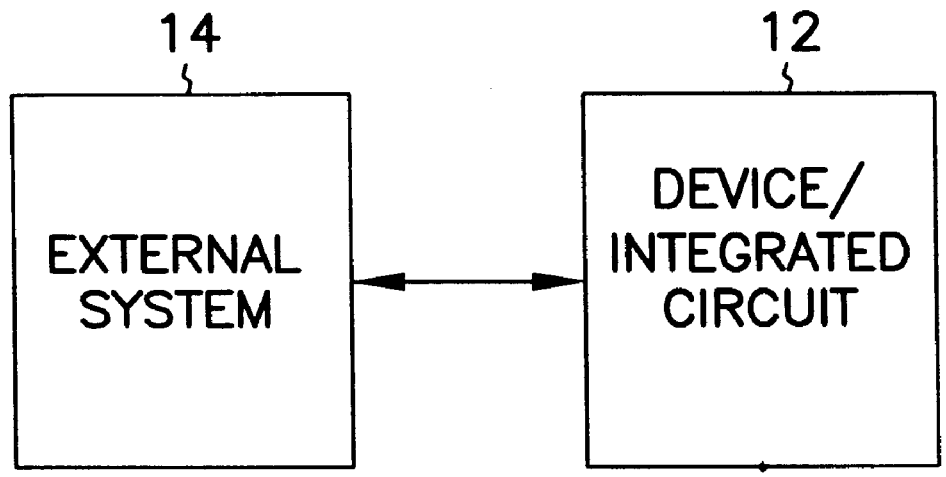
FIG. 1(a) is a block diagram of one embodiment of an integrated circuit coupled to an external system.

The device or integrated circuit 12 may be coupled to an external system 14, as illustrated in FIG. 1(a). The integrated circuit 12 and the external system 14 may be, respectively, a memory such as a DRAM (Dynamic Random Access Memory) and a microprocessor used in a personal computer or other type of device. The device 12 may be a MOS field effect transistor. Alternatively, the external system 14 may be a microcomputer, a cellular telephone, or another form of electronic equipment.

Figure 1B:
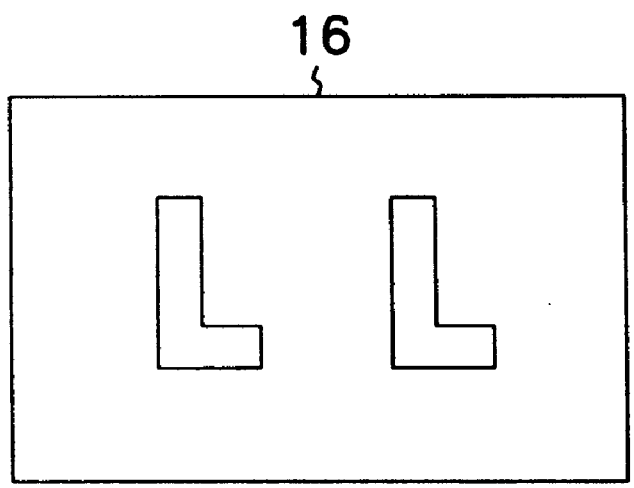
FIG. 1(b) is an aerial view of one embodiment of a mask.

The present invention is useful in fabricating portions of an integrated circuit, such as $CoSi_2$ polycide gate electrodes (word lines) for a DRAM memory and local interconnect conductors. The following process steps are typically accomplished with only one mask. An extremely simple exemplary mask 16 is represented in FIG. 1(b).

Figure 2:
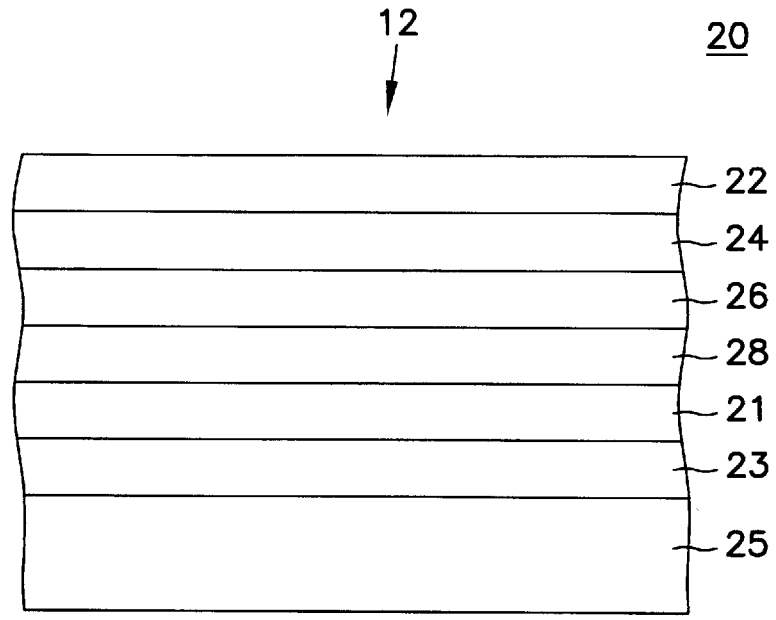
FIG. 2 is a cross-sectional view of one embodiment of an integrated circuit.

Integrated circuit 12 fabrication is commenced with the formation of blanket layers of materials as shown in FIG. 2 at step 20 on top of a base layer 25 such as a substrate. An insulator 23 such as a gate oxide is formed on top of base layer 25, followed by a silicon layer 21 which is polysilicon or amorphous silicon which mar be either doped or undoped. A conductive diffusion barrier 28 is formed on top of the silicon layer 21, followed by a conductor 26, a further silicon layer 24 and a further insulator 22. These materials may be consecutively deposited or otherwise formed using well known techniques on the substrate to form a blanket gate stack for a DRAM using common CVD or PVD processes, one upon another such that layers next to each other are referred to as being adjacent to each other. Insulator 22 is oxide, nitride or other type of electrical insulator and is formed last. Silicon layer 24 comprises a doped layer of polysilicon or amorphous silicon. Conductor 26 is a near noble metal, such as cobalt, nickel, iron or alloys thereof. The conductive diffusion barrier 28 is a nitride, such as either a tungsten nitride layer approximately 50 to 500 Angstroms thick, or titanium nitride. The conductive diffusion barrier 28 should have a good etch selectivity with the conductor 26 during a dry etch or a wet etch process. For example, the conductive diffusion barrier 28 should etch more slowly than the conductor 26. The base layer 25 may be any type of semiconductor, such as silicon.

Figure 3:
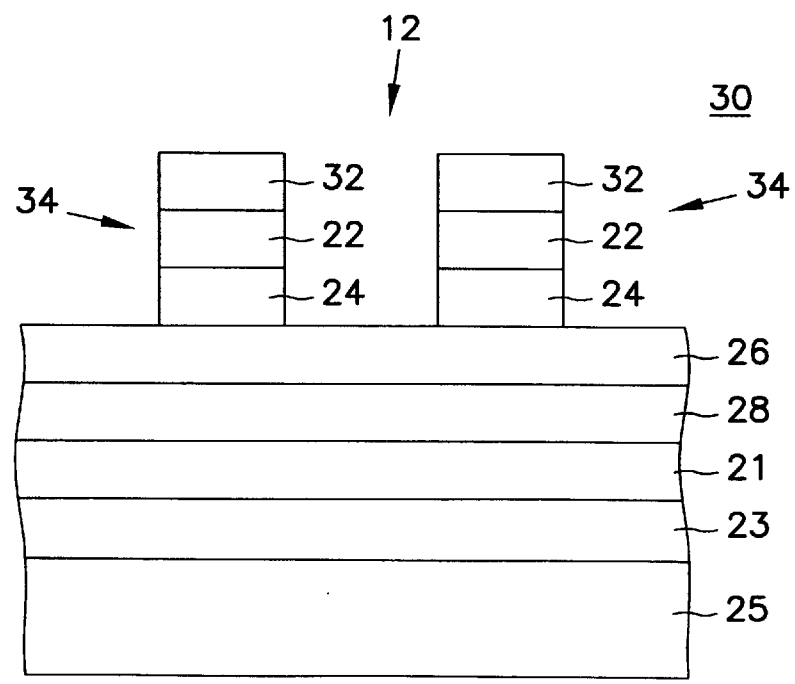
FIG. 3 is a cross-sectional view of one embodiment of an integrated circuit after patterning a masking layer and removing material.

Next, the materials are patterned (step 30 in FIG. 3) such as by radiation based lithography using a mask 16 to substantially define an electrode 34. The patterning is accomplished with a masking layer 32, such as a photo resist which is suitable for use with the radiation used. Materials not covered by the masking layer 32 are removed, for example, by etching, such as dry etching down to the conductor 26. The dry etching may be accomplished with plasma etching, reactive ion etching or a combination thereof. For example, material, including insulator 22 and silicon layer 24, are removed. In general, a dry etch process utilizes chlorine or fluorine based gases, such as $NF_3$, $CF_4$, and $CCl_4$, etc., to remove materials in uncovered areas. Because near noble metal fluorides and chlorides, e.g., cobalt fluorides and chlorides, are highly nonvolatile, the dry etch process stops at the near noble metal conductor 26. Therefore, the conductor 26 also acts as a dry etch stop.

After the material is removed, then the remaining masking layer 32 is also removed from the integrated circuit 12. Patterning, as used herein is defined as both the exposing of resist and the combination of exposing and removing material to define desired structures. It can also mean any other type of method whereby patterns may be defined and created on a substrate.

Figure 4:
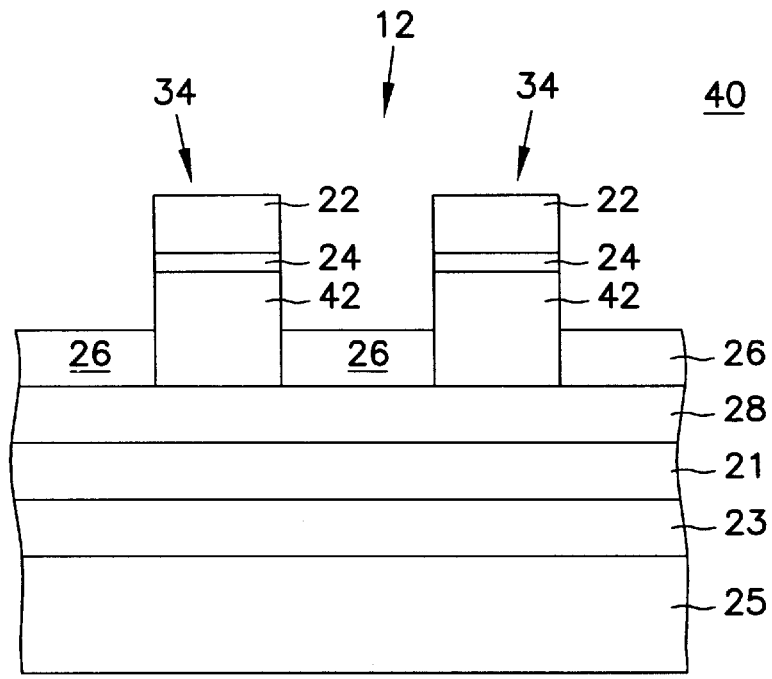
FIG. 4 is a cross-sectional view of one embodiment of an integrated circuit after heating.

Next, the integrated circuit 12 is subjected to RTP (step 40), as illustrated in FIG. 4. The integrated circuit 12 can be heated in a rapid thermal annealer or a furnace between 550° and 850° C. for about 20 seconds. In one embodiment, the preferred temperature range for heating is between about 600° and 750° C.

During heating (step 40), the silicon layer 24 and conductor 26 combine to form a compound 42, such as a silicide. In one embodiment, the conductor 26 is cobalt. The cobalt consumes the silicon to form $CoSi_2$ (cobalt disilicide) during the heating (step 40). Since cobalt atoms are the dominant diffusion species during this salicidation step, straight sidewall profiles of the poly or amorphous silicon are preserved. The thickness of the silicon should be approximately 3.7 times the thickness of the cobalt. Typically, a sufficient thickness of silicon layer 24 should be initially formed (step 20), so that a portion of silicon layer 24 is not converted to the compound 42. The unconverted silicon layer 24 facilitates connection between the electrode and a metal interconnect.

Figure 5:
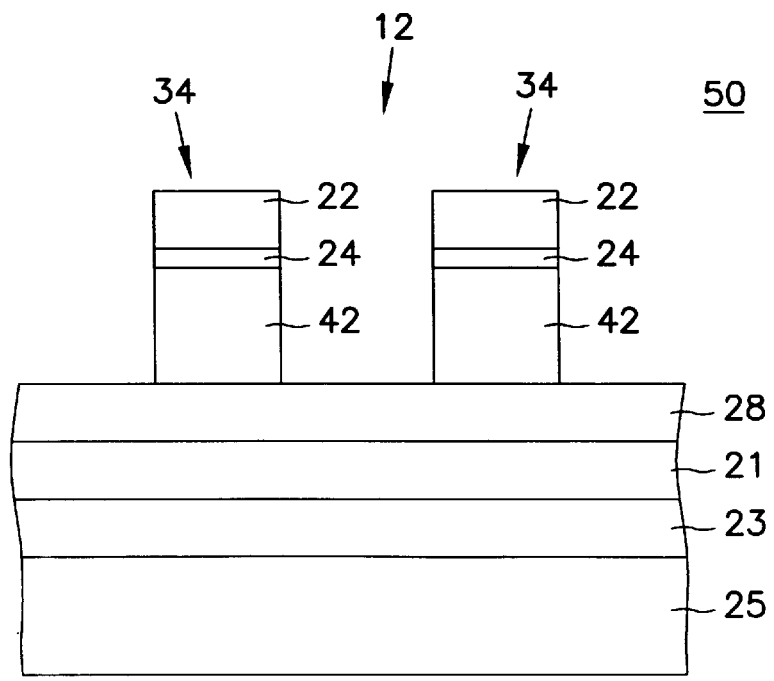
FIG. 5 is a cross-sectional view of one embodiment of an integrated circuit after removing more material.

After heating (step 40), unreacted conductor 26 is removed (step 50), such as by timed wet etching, as illustrated in FIG. 5. The wet etch is performed using etchants with good selectivity with respect to the noble metal. For cobalt, APM (SC1) or SC2 which are well known to persons skilled in the art are suitable. Additionally, some or all of the conductive diffusion barrier 28 may be removed. However, typically, the wet etches remove the conductive diffusion barrier 28 at one half the rate that the conductor 26 is removed. It thus serves as a wet etch stop. Up to approximately 5% of the feature width of the conductive diffusion barrier 28 may be undercut during the etch to reduce gate electrode edge leakage. In one embodiment, dilute $NH_4OH:H_2O_2:H_2O$ in a concentration of approximately 1:1:5, or further diluted with water to 1:1:20 or more is used to etch the unreacted cobalt. This is followed by use of a diluted APM to etch the conductive diffusion barrier 28 as desired. Actual concentrations are easily determined by one skilled in the art and are dependent on materials used.

Figure 6:
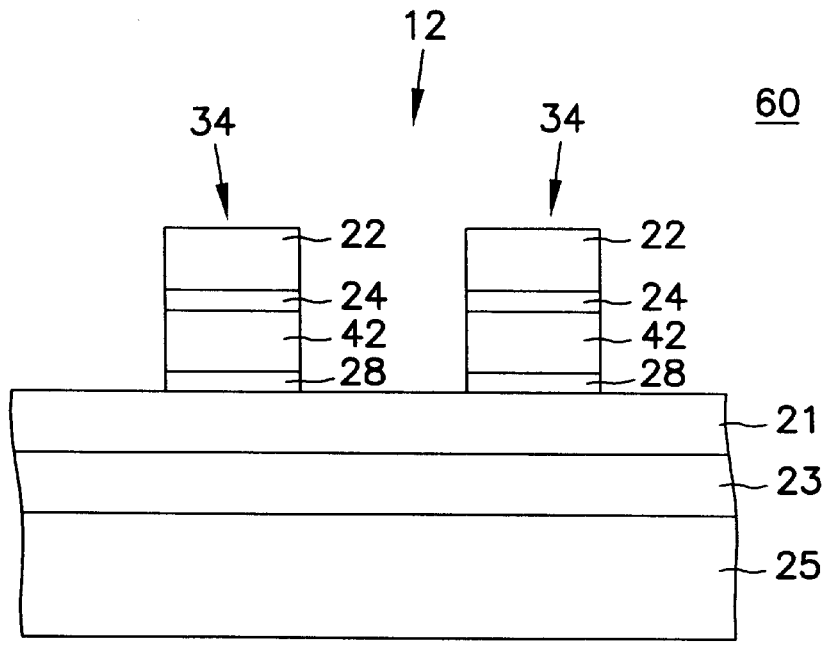
FIG. 6 is a cross-sectional view of a second embodiment of an integrated circuit after removing more material.
Figure 7:
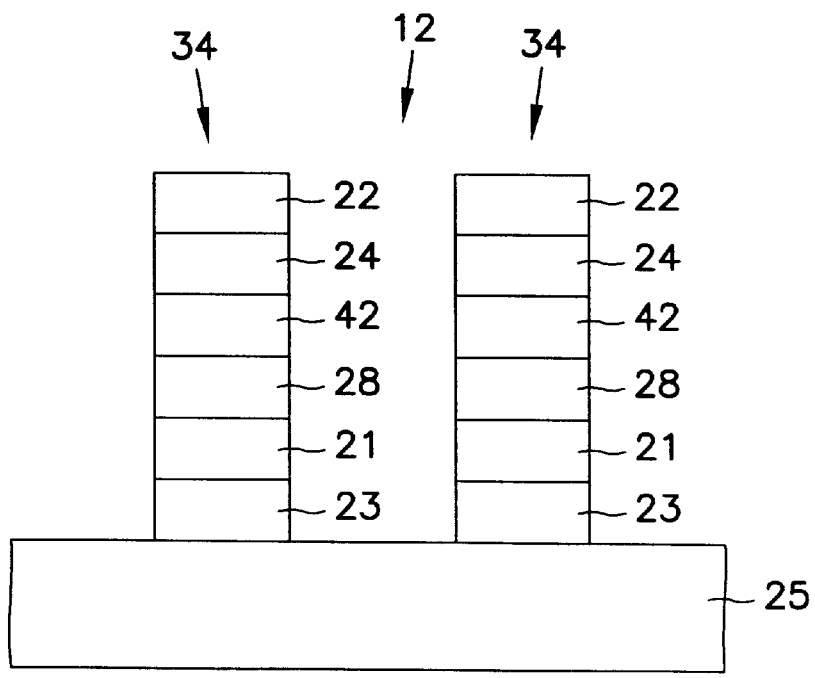
FIG. 7 is a cross-sectional view of one embodiment of an integrated circuit after additional material is removed.

Any remaining conductive diffusion barrier 28, exposed area of silicon layer 21 and insulator 23 are then removed (step 60), such as by dry etching, as illustrated in FIG. 6 and FIG. 7. The dry etch proceeds to the substrate 25 with the already patterned insulator 22 acting as a mask. Thus, the electrode 34 is further defined. Completion of the fabrication of the integrated circuit 12, including spacer formation and source/drain reoxidation is accomplished with standard processing steps well known by persons skilled in the art.

Conductors such as local interconnects are formed in a similar manner on top of oxides, BPSG, and Si source and drain areas. The wet etch stop comprising a conductive diffusion barrier is formed directly on top of the oxide, BPSG layer and Si source and drain areas. This is followed by the near noble metal, silicon, and further oxide which is patterned to define the desired conductors. As above, the substrate is then etched to the noble metal, annealed, and then wet etched to the conductive diffusion barrier, using it as a wet etch stop. A further etch is performed to finish defining the conductor, followed by further normal processing steps.

While the invention has been described with the use of cobalt and silicon, it will be recognized by one skilled in the art that the process of forming the conductors and electrodes may utilize other near noble metals and other types of semiconductor materials which form conductors having a fine grain size. By providing such a fine grain size, the resistance of such conductors is greatly improved as the width of the conductors decreases below sub-quarter micron dimensions. Further, the conductive diffusion barrier material which serves as a wet etch stop may be comprised of many different materials such as titanium and tungsten nitrides and metal silicon nitrides. These materials may also be used to form conductors having widths greater than sub-quarter micron dimensions.

What is claimed is:

1. A method for fabricating a conductor having a near noble metal, comprising:
    forming a blanket stack on a substrate, including a silicon layer on top of the near noble metal which is on top of a conductive diffusion barrier;
    patterning the blanket stack with a mask;
    removing material not under the mask down to the near noble metal to substantially define the conductor;
    annealing the conductor to react the near noble metal and the silicon;
    etching the unreacted near noble metal; and
    using the conductive diffusion barrier as an etch stop.

2. The method of claim 1, wherein some of the silicon remains after formation of the compound.

3. The method of claim 1, wherein the step of etching the unreacted near noble metal further comprises the step of removing some of the diffusion barrier beneath the near noble metal.

4. The method of claim 1, wherein the near noble metal is cobalt.

5. The method of claim 1, wherein the conductive diffusion barrier is selected from the group consisting of titanium nitride, tungsten nitride, and metal silicon nitride.

6. The method of claim 1, wherein the conductive diffusion barrier is selected from the group consisting of tungsten silicon nitride and titanium silicon nitride.

7. The method of claim 1, wherein the thickness of the conductive diffusion barrier is 50 to 500 Angstroms.

8. The method of claim 1, wherein the patterning and removing steps are performed with the use of only one mask.

9. A method for fabricating an integrated circuit having an electrode including $CoSi_2$, comprising:
    forming blankets of material, including a conductive diffusion barrier adjacent to cobalt, and silicon;
    patterning the material;
    removing unpatterned silicon to substantially define the electrode;
    annealing the electrode to react the cobalt and silicon to form $CoSi_2$;
    removing unreacted cobalt while removing none or only a portion of the diffusion barrier adjacent to the cobalt.

10. The method of claim 9, wherein cobalt is a dominant diffusion species as it reacts with the silicon to preserve a substantially straight sidewall of the electrode.

11. The method of claim 9, wherein the step of removing unreacted cobalt further comprises the step of removing some of the diffusion barrier adjacent to the cobalt.

12. The method of claim 9, wherein the patterning and removing steps are performed utilizing only one mask.

13. The method of claim 9, wherein the conductive diffusion barrier is selected from the group consisting of titanium nitride, tungsten nitride, and metal silicon nitride.

14. The method of claim 9, wherein the conductive diffusion barrier is selected from the group consisting of tungsten silicon nitride and titanium silicon nitride.

15. The method of claim 9, wherein the thickness of the conductive diffusion barrier is 50 to 500 Angstroms.

16. The method of claim 9, wherein the step of patterning is performed on an integrated circuit coupled to a microprocessor.

17. The method of claim 9, wherein the step of patterning is performed on an integrated circuit comprising a DRAM memory device.

18. A method for fabricating an integrated circuit having an electrode including cobalt and silicon, comprising:
    patterning the electrode comprising silicon on cobalt;
    removing unpatterned silicon to substantially define the electrode;
    annealing the electrode at a temperature of at least 550 degrees Celsius to react the cobalt and silicon to form $CoSi_2$;
    removing unreacted cobalt with a timed wet etch of at least one of APM and SC2; and
    stopping the removal of unreacted cobalt at a conductive diffusion barrier layer.

19. The method of claim 18, wherein cobalt is a dominant diffusion species as it reacts with the silicon to preserve a substantially straight sidewall of the electrode.

20. The method of claim 18, wherein the step of removing unreacted cobalt also removes some of the conductive diffusion barrier.

21. The method of claim 20, wherein no more than approximately five percent of the conductive diffusion barrier feature width is under cut during removing of some of the conductive diffusion barrier.

22. The method of claim 18, wherein the conductive diffusion barrier is selected from the group consisting of titanium nitride, tungsten nitride, and metal silicon nitride.

23. The method of claim 18, wherein the conductive diffusion barrier is selected from the group consisting of tungsten silicon nitride and titanium silicon nitride.

24. The method of claim 18, wherein the thickness of the conductive diffusion barrier is 50 to 500 Angstroms.

25. The method of claim 18, wherein the patterning and removing steps are performed utilizing only one mask.

26. The method of claim 18, wherein the step of patterning is performed on an integrated circuit coupled to a microprocessor.

27. The method of claim 18, wherein the step of patterning is performed on an integrated circuit comprising a DRAM.

28. A method for fabricating an electrode having cobalt and silicon, comprising:
    forming blankets of material, including the cobalt and silicon on a substrate;
    patterning the material;
    removing unpatterned silicon to substantially define the electrode;

annealing the electrode to react the cobalt and silicon to form $CoSi_2$; and removing unreacted cobalt.

29. The method of claim 28, wherein some silicon remains after formation of the $CoSi_2$.

30. The method of claim 28, wherein the step of removing unreacted cobalt further comprises the step of partially removing a diffusion barrier adjacent to the unreacted cobalt.

31. The method of claim 30, wherein the conductive diffusion barrier is selected from the group consisting of titanium nitride, tungsten nitride, and metal silicon nitride.

32. The method of claim 30, wherein the conductive diffusion barrier is selected from the group consisting of tungsten silicon nitride and titanium silicon nitride.

33. The method of claim 30, wherein the thickness of the conductive diffusion barrier is 50 to 500 Angstroms.

34. The method of claim 28, wherein the patterning and removing steps are performed with the use of only one mask.

35. A method for forming a conductive line for a semiconductor device, comprising:

forming a blanket stack on a substrate comprising consecutive layers of a gate oxide, a silicon layer, a diffusion barrier, a near noble metal, a second silicon layer and an oxide layer;

patterning the blanket stack with resist to define the conductive line;

etching the patterned blanket stack down to the near noble metal;

stripping the resist;

annealing the blanket stack to react the near noble metal with the second silicon layer;

wet etching unreacted near noble metal to remove it;

dry etching the blanket stack, using the patterned oxide layer as a mask.

36. The method of claim 35, wherein the first Si layer is doped polysilicon.

37. The method of claim 35, wherein the second silicon layer is selected from the group consisting of undoped and doped polysilicon, and undoped and doped amorphous silicon.

38. The method of claim 35, wherein the conductive diffusion barrier is selected from the group consisting of titanium nitride, tungsten nitride, and metal silicon nitride.

39. The method of claim 35, wherein the conductive diffusion barrier is selected from the group consisting of tungsten silicon nitride and titanium silicon nitride.

40. The method of claim 35, wherein the thickness of the conductive diffusion barrier is 50 to 500 Angstroms.

41. The method of claim 35, wherein the conductive line comprises a polysilicon gate stack of a DRAM.

42. A method for forming a conductive line for a semiconductor device, comprising:

forming a blanket stack on a substrate comprising consecutive layers of a gate oxide, a silicon layer, a diffusion barrier, cobalt, a second silicon layer and an oxide layer;

patterning the blanket stack with resist to define the conductive line;

etching the patterned blanket stack down to the cobalt;

stripping the resist;

annealing the blanket stack to react the cobalt with the second silicon layer to form $CoSi_2$;

wet etching unreacted cobalt to remove it;

dry etching the blanket stack, using the patterned oxide layer as a mask.

43. The method of claim 42, wherein the step of dry etching the blanket stack etches the blanket stack substantially down to the substrate.

44. The method of claim 42, wherein the conductive diffusion barrier is selected from the group consisting of titanium nitride, tungsten nitride, and metal silicon nitride.

45. The method of claim 42, wherein the conductive diffusion barrier is selected from the group consisting of tungsten silicon nitride and titanium silicon nitride.

46. The method of claim 42, wherein the thickness of the conductive diffusion barrier is 50 to 500 Angstroms.

* * * * *